(12) United States Patent
Kim et al.

(10) Patent No.: US 6,356,685 B1
(45) Date of Patent: Mar. 12, 2002

(54) GAIN CONTROL DEVICE IN SEMICONDUCTOR OPTICAL AMPLIFIER USING OPTICAL FIBER GRATING

(75) Inventors: Dong Hwan Kim; Sang Bae Lee; Jae Cheol Jo; Sang Sam Choi; Young Min Jhon; Sang Hyuck Kim, all of Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 12 days.

(21) Appl. No.: 09/680,254

(22) Filed: Oct. 5, 2000

(30) Foreign Application Priority Data

Feb. 7, 2000 (KR) .......................................... 2000-5630

(51) Int. Cl.$^7$ ................................................. G02B 6/34
(52) U.S. Cl. ........................... 385/37; 385/24; 385/27; 385/42; 372/50; 372/102; 359/344; 359/33
(58) Field of Search ........................... 385/37, 24, 27, 385/42, 123, 141; 372/50, 6, 20, 102, 96; 359/344, 124, 134, 333, 337, 130

(56) References Cited

U.S. PATENT DOCUMENTS 5,991,068 A * 11/1999 Massicott et al. ............ 359/337
6,137,932 A * 10/2000 Kim et al. ..................... 385/37

* cited by examiner

Primary Examiner—Phan T. H. Palmer
(74) Attorney, Agent, or Firm—Bacon & Thomas

(57) ABSTRACT

The gain control device in a semiconductor optical amplifier using an optical fiber grating includes an input unit for receiving an optical signal, an output unit for outputting an amplified optical signal, and input and output optical isolators connected to the input and output units to establish paths of the input and output optical signals. The gain control device further includes a tension-controllable optical fiber grating connected to the input optical isolator for fine adjustment of a reflection peak wavelength. A semiconductor optical amplifier connected to the tension-controllable optical fiber grating is also provided to amplify the optical signal. A power supply supplies power to the semiconductor optical amplifier to drive the optical amplifier. In addition, an optical fiber grating is connected to the semiconductor optical amplifier and has a predetermined reflection peak wavelength.

5 Claims, 2 Drawing Sheets

GAIN CONTROL DEVICE IN SEMICONDUCTOR OPTICAL AMPLIFIER USING OPTICAL FIBER GRATING

BACKGROUND OF THE INVENTION

1. Technical Field

The present invention relates to a gain control device in a semiconductor optical amplifier using an optical fiber grating, and more particularly to a gain control device in a semiconductor optical amplifier using an optical fiber grating which uses the optical fiber grating of the semiconductor optical amplifier, which is usually used for a semiconductor optical switching element or a wave converter, to easily control the gain.

2. Description of the Prior Art

A semiconductor optical amplifier directly amplifies an optical signal without any electric conversion. If being constructed in the same structure as a semiconductor laser using compound materials of a semiconductor and making a nonreflecting coating on both sides, the semiconductor optical amplifier may amplify a weak input optical signal.

Because the semiconductor optical amplifier may amplify the optical signal with a high gain through a very wide range of wavelength in a 1.55 μm bandpass optical communication system and has a size much smaller than other optical amplifier, this amplifier can be made in an integrated chip, so spreading its applications like a wave converter or an optical switching and particularly being used as an essential element in an optical cross connect (OXC) system.

However, because an optical signal of a channel corresponding to a certain wavelength varies regardless of other channels in a multi-wave OXC system, strength of all optical signals inputted to the semiconductor optical amplifier as a result varies in a significantly wide range as operation time passes. In this case, the gain in the semiconductor optical amplifier also changes according to the strength of all input optical signals owing to a gain saturation characteristic, which results in jittering an output optical signal. Therefore, a gain of a certain channel is effected by strength of other channels and so unstableness of the gain described above may be deterrent to operate the OXC system.

To solve the problem, there is known a method which employs a phenomenon of making the semiconductor optical amplifier cause oscillation in waves other than a wave of the optical signal using a laser, so varying the oscillated optical strength according to variance of the input optical signal. Using the method, the gain may become stable because the gain of the semiconductor optical amplifier is constant regardless of the strength variance of the input optical signal. For example, a method (Alcatel Gain-clamped SOA) of employing a Pabro-Perot resonator in which the optical fiber gratings are inserted into both input and output terminals of the semiconductor optical amplifier, to oscillate reflective waves of two optical fiber gratings.

However, this method may simplify a structure of the semiconductor optical amplifier but not suggest a technique to control the gain of the amplifier. So, the conventional method has a defect that it may not control the gain easily.

SUMMARY OF THE INVENTION

The present invention is designed to solve the problem of the prior art. An object of the invention is to provide a gain control device in a semiconductor optical amplifier using an optical fiber grating, which may easily control the gain of the semiconductor optical amplifier using the optical fiber grating.

In order to accomplish the above object, the present invention provides a gain control device in a semiconductor optical amplifier using an optical fiber grating, which includes an input unit for receiving an optical signal, an output unit for outputting an amplified optical signal, and input and output optical isolators connected to the input and output units to establish paths of the input and output optical signals. The gain control device further includes a tension-controllable optical fiber grating connected to the input optical isolator for fine adjustment of a reflection peak wavelength. A semiconductor optical amplifier connected to the tension-controllable optical fiber grating is also provided to amplify the optical signal. A power supply supplies power to the semiconductor optical amplifier to drive the optical amplifier. In addition, an optical fiber grating is connected to the semiconductor optical amplifier and has a predetermined reflection peak wavelength.

BRIEF DESCRIPTION OF THE DRAWINGS

These and other features, aspects, and advantages of the present invention will become better understood with regard to the following description, appended claims, and accompanying drawings, in which like components are referred to by like reference numerals. In the drawings:

DETAILED DESCRIPTION OF THE PREFERRED EMBODIMENT

Hereinafter, preferred embodiments of the present invention will be described in detail with reference to the accompanying drawings.

Figure 1:
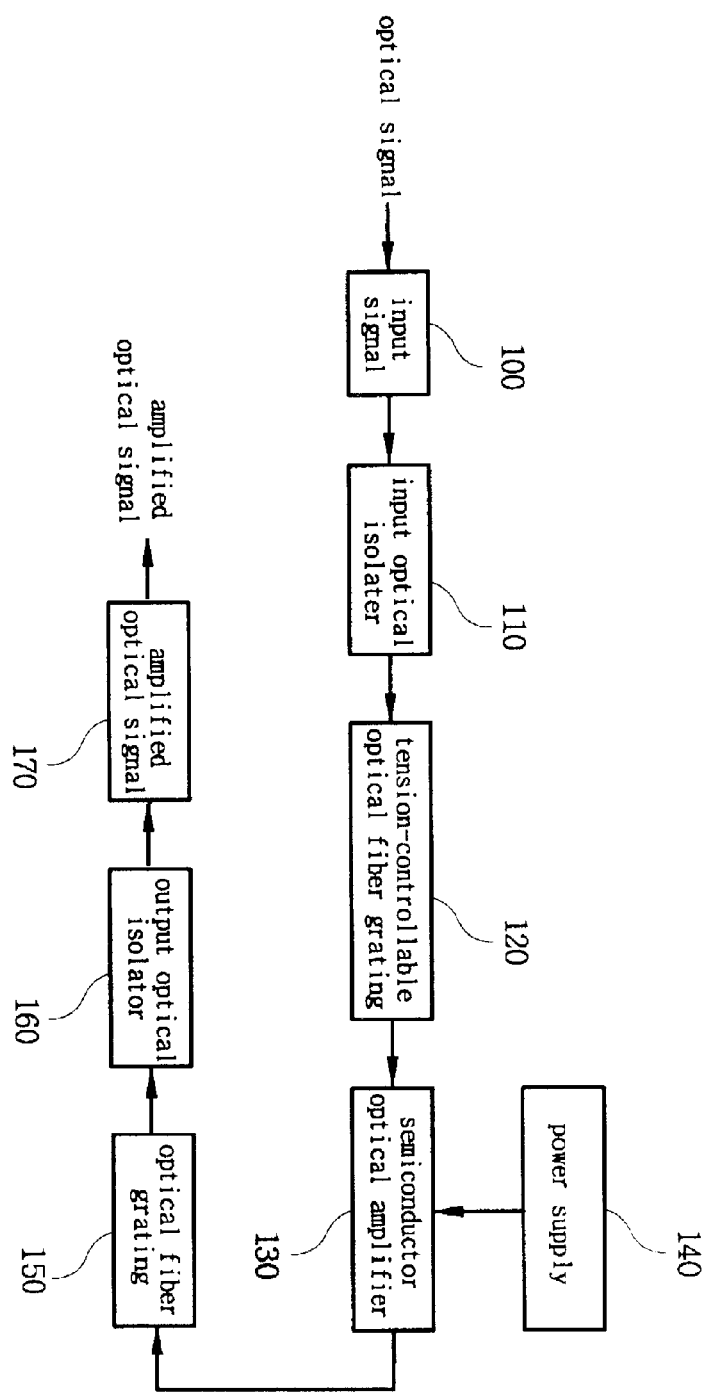
FIG. 1 is a block diagram showing a gain control device in a semiconductor optical amplifier using an optical fiber grating according to the present invention.

FIG. 1 is a block diagram showing a gain control device in a semiconductor optical amplifier using an optical fiber grating according to the present invention.

As shown in FIG. 1, the gain control device includes an input unit 100 for inputting an optical signal, an output unit 170 for outputting an amplified optical signal, and input and output optical isolators 110, 160 connected to the input unit 100 and the output unit 170 to establish paths of the input and output optical signals. The gain control device also includes a tension-controllable optical fiber grating 120 which is connected to the input optical isolator 110 for fine adjustment of a reflection peak wavelength. The gain control device also includes a semiconductor optical amplifier 130 which is connected to the tension-controllable optical fiber grating 120 to amplify the optical signal. The gain control device further includes a power supply 140 for supplying power to the semiconductor optical amplifier 130 to drive the optical amplifier. The gain control device is also provided with an optical fiber grating connected to the semiconductor optical amplifier 130 and having a predetermined reflection peak wavelength.

The input unit 100 receives an optical signal and applies the optical signal to the input optical isolator 110. The optical signal from the input unit then passes through the input optical isolator 110 or is transmitted to other paths.

The tension-controllable optical fiber grating 120 receives an output signal of the input optical isolator 100, which is then reflected in or passes through the tension-controllable optical fiber grating 120.

The tension-controllable optical fiber grating 120 may control its tension by using a fine adjustment unit, not shown in the figure, to make it possible to vary a reflection peak wavelength.

The semiconductor optical amplifier 130 receives an output optical signal of the tension-controllable optical fiber grating 120 and amplifies the signal. At this time, the tension-controllable optical fiber grating 120 and the optical fiber grating 150 play an important role in controlling an amplified gain of the semiconductor optical amplifier 130.

The tension-controllable optical fiber grating 120 and the optical fiber grating 150 are respectively installed at both ends of the semiconductor optical amplifier 130 and play a role of a resonator such that the semiconductor optical amplifier 130 may cause oscillation in a certain wave.

In this case, the tension-controllable optical fiber grating 120 and the optical fiber grating 150 may have same peak wavelength of 1547.1 nm and different maximum reflectance of 0.5 and 0.47, as an example.

The semiconductor optical amplifier 130 has a homogeneous line broadening characteristic. Therefore, a gain of the semiconductor optical amplifier 130 is determined by a total optical loss that the resonator has in a wavelength oscillated by both optical fiber gratings 120, 150.

The gain of the semiconductor optical amplifier in an oscillated state is as follows.

Formula 1

$$G_o(\lambda) = 5\log\left(\frac{1}{R_{tot}}\right) + C(\lambda)$$

in which, $\lambda$ is an optical wavelength, $G_o(\lambda)$ is a gain of the semiconductor optical amplifier in a given wavelength $\lambda$, and $C(\lambda)$ is a parameter showing a characteristic of the semiconductor optical amplifier according to a frequency.

$R_{tot}$ is a total reflectance, which is determined by a distance between peak wavelengths of both optical fiber gratings 120, 150. This formula is more easily understood with reference of FIG. 2 and more detailed description thereof.

Figure 2:
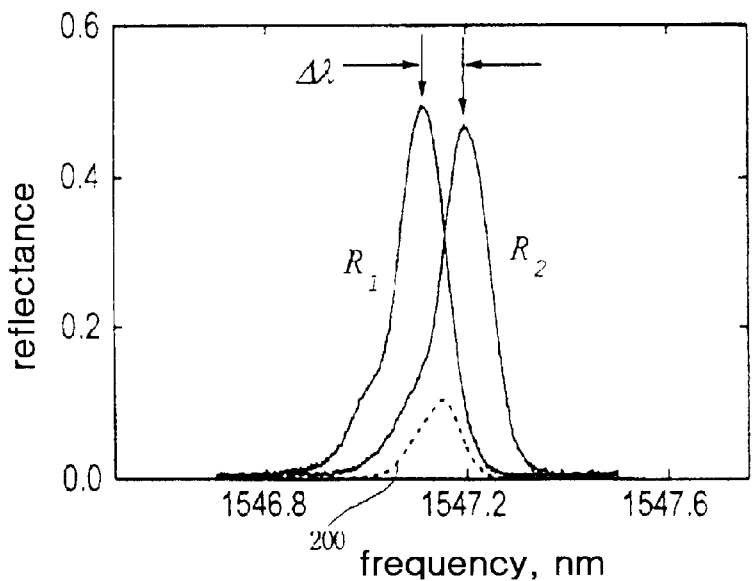
FIG. 2 shows examples of a reflectance spectrum of a tension-controllable optical fiber grating and a reflectance spectrum of an optical fiber grating of the present invention.

FIG. 2 shows an example of a reflectance spectrum of the tension-controllable optical fiber grating and a reflectance spectrum of the optical fiber grating.

A reflective bandwidth of the optical fiber grating is generally very narrow rather than that of the semiconductor optical amplifier so that the semiconductor optical amplifier causes oscillation in a wavelength having a maximum reflectance. Assuming that the total optical loss depends on no more than the reflectance spectrum of the optical fiber grating, the total reflectance $R_{tot}$ is determined by the following formula.

$$R_{tot=MAX\{R_1(\lambda)R_2(\lambda)\}} \quad \text{Formula 2}$$

in which $R_1(\lambda)$ is the reflectance spectrum of the tension-controllable optical fiber grating, and $R_2(\lambda)$ is the reflectance spectrum of the optical fiber grating, $R_{tot}$ is a maximum one among multiplied values of the reflectance spectrums, and $\lambda$ is an oscillated wavelength.

A dotted line 200 in FIG. 2 indicates a total reflectance.

Referring to the dotted line 200, it can be easily understood that the total reflectance has a maximum value when the peak wavelengths of both optical fiber gratings are coincident and has a smaller value as the distance between the peak wavelengths are increasing.

When combining the formula 1 with the formula 2, it can be seen that the gain of the semiconductor optical amplifier is determined by the difference between both optical fiber gratings.

The gain of the semiconductor optical amplifier has a maximum value when the peak wavelengths of both optical fiber gratings are crossed each other so that the total reflectance is less than a threshold of the laser oscillation, while the gain has a minimum value when the peak wavelengths of both optical fiber gratings coincide.

Figure 3:
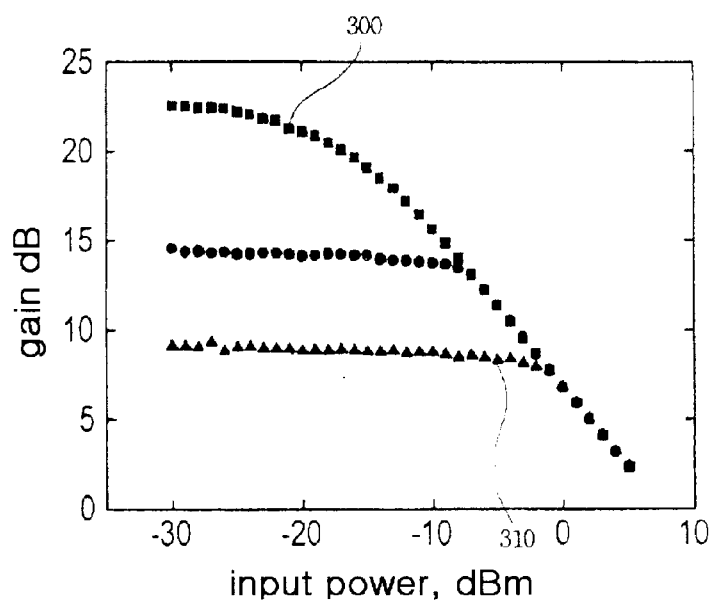
FIG. 3 shows a gain varying characteristic of a semiconductor optical amplifier according to strength of an input signal depending on a difference between a reflection peak wavelength of the tension-controllable optical fiber grating and a reflection peak wavelength of the optical fiber grating.

FIG. 3 shows a gain varying characteristic of a semiconductor optical amplifier according to strength of an input signal depending on a difference between a reflection peak wavelength of the tension-controllable optical fiber grating and a reflection peak wavelength of the optical fiber grating.

As shown in FIG. 3, three cases with different total reflectance show different gain varying characteristics depending on the strength of the input signal. As the difference between the peak wavelength of the tension-controllable optical fiber grating and the peak wavelength of the optical fiber grating increases, the total reflectance becomes decreasing so that the gain grows for the strength of the input signal, while, as the difference between the peak wavelengths, the total reflectance gets increasing so that the gain of the input signal decreases.

In FIG. 3, a curve 300 consisting of rectangular points has a maximum total reflectance and a curve 310 consisting of triangular points has a minimum total reflectance. On the contrary, the gain for the strength of the input signal is most at the curve 300 consisting of rectangular points and least at the curve 310 consisting of triangular points.

As described above, the gain control device in a semiconductor optical amplifier using an optical fiber grating, which includes an input unit for receiving an optical signal, an output unit for outputting an amplified optical signal, and input and output optical isolators connected to the input and output units to establish paths of the input and output optical signals, further includes a tension-controllable optical fiber grating connected to the input optical isolator for fine adjustment of a reflection peak wavelength, a semiconductor optical amplifier connected to the tension-controllable optical fiber grating to amplify the optical signal, a power supply for supplying power to the semiconductor optical amplifier to drive the optical amplifier, and an optical fiber grating connected to the semiconductor optical amplifier and having a predetermined reflection peak wavelength, and it has an effect that it may adjust the gain of the semiconductor optical amplifier by controlling a distance between the reflection peak wavelength of the tension-controllable optical fiber grating and the reflection peak wavelength of the optical fiber grating.

The gain control device according to the present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A gain control device in a semiconductor optical amplifier using an optical fiber grating, which includes an input unit for receiving an optical signal, an output unit for outputting an amplified optical signal, and input and output optical isolators connected to the input and output units to establish paths of the input and output optical signals, the gain control device comprising:

- a tension-controllable optical fiber grating connected to the input optical isolator for fine adjustment of a reflection peak wavelength;
- a semiconductor optical amplifier connected to the tension-controllable optical fiber grating to amplify the optical signal;
- a power supply for supplying power to the semiconductor optical amplifier to drive the optical amplifier; and
- an optical fiber grating connected to the semiconductor optical amplifier and having a predetermined reflection peak wavelength.

2. The gain control device as claimed in claim 1, wherein the semiconductor optical amplifier determines the gain according to the following formula, $$G_o(\lambda) = 5\log\left(\frac{1}{R_{tot}}\right) + C(\lambda)$$

in which, $G_0(\lambda)$ is a gain of the semiconductor optical amplifier in a given wavelength $\lambda$, $C(\lambda)$ is a parameter showing a characteristic of the semiconductor optical amplifier according to a frequency, and $R_{tot}$ is a total reflectance.

3. The gain control device as claimed in claim 2, wherein the total reflectance is determined by the following formula, $$R_{tot} = MAX\{R_1(\lambda)R_2(\lambda)\}$$

in which $R_{tot}$ is a total reflectance, $R_1(\lambda)$ is a reflectance spectrum of the tension-controllable optical fiber grating, and $R_2(\lambda)$ is a reflectance spectrum of the optical fiber grating.

4. The gain control device as claimed in claim 3;

wherein the total reflectance is decreasing as a distance between a reflection peak wavelength of the tension-controllable optical fiber grating and a reflection peak wavelength of the optical fiber grating becomes smaller, while the total reflectance increases as the distance between a reflection peak wavelength of the tension-controllable optical fiber grating and a reflection peak wavelength of the optical fiber grating becomes bigger.

5. The gain control device as claimed in claim 1, wherein the tension-controllable optical fiber grating is configured to adjust a distance between the optical fiber grating and a peak wavelength by changing the reflection peak wavelength in order to adjust the gain of the semiconductor optical amplifier as desired.

* * * * *